United States Patent [19]

Tracy et al.

[11] Patent Number: 4,812,754

[45] Date of Patent: Mar. 14, 1989

[54] CIRCUIT BOARD INTERFACING APPARATUS

[76] Inventors: Theodore A. Tracy, 5861 Carbeck, Huntington Beach, Calif. 92648; George H. Freuler, 1164 North Holly St., Anaheim, Calif. 92801

[21] Appl. No.: 1,162

[22] Filed: Jan. 7, 1987

[51] Int. Cl.[4] ............................................. G01R 31/02
[52] U.S. Cl. .............................. 324/158 F; 324/72.5; 324/73 PC; 324/158 P
[58] Field of Search .......... 324/158 F, 158 P, 73 PC, 324/72.5

[56] References Cited

U.S. PATENT DOCUMENTS 3,970,934 7/1976 Aksu ................................. 324/158 F Primary Examiner—Ernest F. Karlsen
Attorney, Agent, or Firm—Loyal M. Hanson; Gordon L. Peterson

[57] ABSTRACT

An apparatus for interfacing a circuit board to a testing system includes a support structure movably supporting a pair of first and second test heads in confronting relationship, at least the first test head having a plurality of probes with which to contact test points on a circuit board to be tested. Actuating components enable movement of the test heads from a spaced apart loading position to a more closely spaced apart testing position in which each one of the probes is urged into contact with a respective one of the test points. An electrical bus interfaces a separate testing system to at least the first test head, and a plurality of operator accessible, electrically conductive contacts that are each electrically connected to a respective one of the lines of the electrical bus, enables convenient electrical connection to the lines for diagnostic purposes. One form of the invention causes the test heads to pivot from the loading position and then advance linearly to the testing position so that movement of the probes across the test points is limited, while test head alignment components retain the test heads in precise alignment.

24 Claims, 6 Drawing Sheets

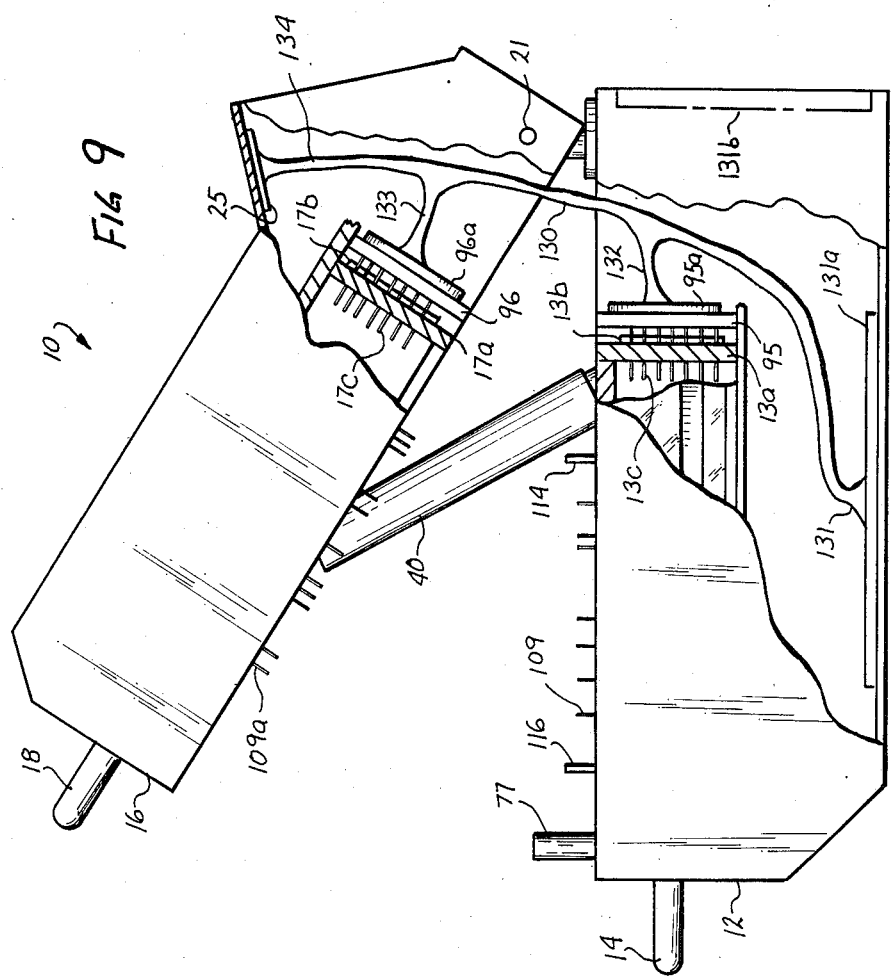

CIRCUIT BOARD INTERFACING APPARATUS

BACKGROUND OF THE INVENTION

1. Technical Field

This invention relates generally to circuit board testing, and more particularly to a new and improved apparatus for interfacing a circuit board to existing circuit board testing equipment.

2. Background Information

Circuit board testing includes the testing of printed circuit boards (PCB's), backplanes, wirewrap boards, and circuits with conventional and surface mounted devices (SMD's) or a large number of sockets. It often proceeds with the aid of a testing system or host machine designed to supply test signals to the circuit board and detect resulting circuit board signals. Doing this under computer control enables thorough analysis of the circuit board during development and efficient testing during production.

A conventional computerized host machine, for example, generates various host signals, such as supply voltages, input signals, and control signals, for use in causing the circuit board to function throughout a predetermined range of operating conditions. As this is done, a detection portion of the host machine senses resulting circuit board signals for analysis. In this manner, complex testing proceeds with significant speed and flexibility and little operator involvement.

However, connecting or interfacing the host machine signal lines to the circuit board presents certain problems that need to be overcome. First, the circuit board may have a large number of miniature components of varying sizes, and each component lead may constitute one test point to which to connect the signal lines. In addition, the circuit board may be double-sided with test points on each side, so that in many cases the circuit board may have well over a thousand test points with spacing between adjacent test points on the order of one millimeter.

Furthermore, the pattern in which the test points are disposed on one type of circuit board is usually unlike the test point pattern of another board. This further compounds the problem of connecting the host machine signal lines when use with more than one type of circuit board is contemplated. Thus, the task of interfacing the host machine involves numerous connections so that the interfacing equipment is of recognized significance, and each detail of design correspondingly important.

Existing equipment for interfacing a circuit board to a given host machine often takes the form of a fixture dedicated to use with a particular host machine and a specified circuit board. The fixture serves as a support structure with which to hold the circuit board, and it includes a host machine interface, such as a cable connector or a contact panel, for connecting the host machine signal lines electrically to an array of commercially available spring contact probes mounted on the fixture.

The host machine interface is configured to mate with an output connector arrangement on the particular host machine employed, and the probes are arranged in a probe pattern adapted to mate with the test point pattern on one side of the specific circuit board to be tested. Thus, the fixture holds the circuit board and retains the probes in contact with the test points, thereby interfacing the circuit board to the host machine for testing purposes.

Although providing an interface, such dedicated equipment suffers from the drawback of being relatively expensive. It involves the fabrication of a different fixture for each different host system and circuit board to be tested, or at least rather complex modifications to accommodate them. Consequently, it is desirable to have a new and improved interfacing apparatus that overcomes this concern to enable use with various host machines and circuit boards.

Apart from the dedicated nature of existing interfacing equipment, certain other drawbacks need to be overcome. For example, some existing equipment employs a moving plate that accepts and retains the circuit board under vacuum pressure. The vacuum pressure holds the circuit board in a position against the plate such that the probes contact the test points, and this is done to test one circuit board side at a time.

This results in a test procedure that is somewhat inconvenient and time consuming. In addition, the use of vacuum pressure requires a more complex fixture that fits the contour of the specific circuit board to be tested, not just mate with the test point pattern. Although pneumatically actuated techniques have been employed in some fixtures, these also limit testing to one side at a time. Consequently it is desirable to have a new and improved apparatus that overcomes this concern also, to enable convenient testing of fully loaded, double-sided circuit boards.

Furthermore, existing interfacing equipment often employs a pair of platens which close like a clam shell upon the circuit board in order to move the probes into contact with the test points. However, the clam shell action causes the probes to move slightly in a direction parallel to the circuit board surface so that the probe tips slide across the test points during loading, often abrasively. This frequently causes damage to the circuit board components, as well as the probes, so that an improved loading action is desirable as well.

Moreover, existing interfacing equipment often impairs operator diagnosis of the circuit board or test equipment. It does so because the operator cannot conveniently connect the test probe of an oscilloscope or other instrument to the test points when the circuit board is mounted within the fixture. Instead, the operator must open the fixture to gain access to the circuit board test points, and this involves additional time and inconvenience. Therefore, it is desirable to have an interfacing apparatus that overcomes this concern with features enabling such operator diagnostics without disconnecting the circuit board.

SUMMARY OF THE INVENTION

This invention recognizes the problems associated with the prior art and provides a new and improved interfacing apparatus with the desired attributes.

Briefly, the above and further objects of the present invention are realized by providing an apparatus that includes a support structure and a pair of first and second test heads mounted in confronting relationship on the support structure. The test heads may take the form of removable drawers, at least the first one of which includes a plurality of probes with which to contact a corresponding plurality of test points on a circuit board to be tested. Thus, various drawers or test heads can be used with one support structure to convert it to use in testing various circuit board types.

Actuating components enable movement of the test heads from a spaced apart loading position enabling placement of the circuit board between the test heads to a more closely spaced apart testing position in which each one of the probes is urged into contact with a respective one of the test points. In one form of the invention, the actuating components provide an improved pneumatically driven, parallel loading action that causes the test heads to pivot from the loading position and then advance linearly to the testing position so that movement of the probes across the test points is limited. This reduces abrasive damage to the probes and circuit board components.

An electrical bus in the form of a plurality of electrically conductive lines interfaces a separate testing system to at least the first test head. This is accomplished according to one aspect of the invention with a test head connector panel on the support structure that includes an array of electrical conductive contacts connected to respective ones of the lines of the electrical bus. Probes mounted on the back panel of the test head are urged into engagement with the contacts as the test head is mounted on the support structure, and in this way the probes are connected to selected ones of the lines of the electrical bus, and thereby to selected ones of the signal lines of the testing system.

The apparatus also includes a plurality of operator accessible, electrically conductive contacts that are each electrically connected to a respective one of the lines of the electrical bus. These may take the form of a panel of contacts mounted in a conveniently accessible position on the support structure, and they serve as means enabling an operator to conveniently connect instruments to the lines for diagnostic purposes.

According to one aspect of the invention, both test heads are removably mounted and provided with probes to enable simultaneous testing of both sides of a double-sided circuit board. According to another aspect, a guide pin on one of the test heads is received in a mating guide hole on the other test head, and this arrangement serves as alignment means for retaining the support members in desired alignment as the support members are moved to the testing position. Yet another aspect introduces ionized air adjacent the circuit board to inhibit static damage, and operator controls facilitate fail-safe operation.

Thus, the apparatus of this invention overcomes many drawbacks of existing interfacing equipment. The diagnostic access panel facilitates operator diagnostics by providing parallel connections to each of the lines so that an operator can conveniently monitor any one. The test heads enable convenient testing of fully loaded, double-sided circuit boards, and the apparatus can be easily converted to use with various testing systems and circuit boards. Only the removable test heads are dedicated, instead of the entire apparatus.

Furthermore, the parallel loading action reduces abrasive damage to the probes and circuit board components while the antistatic and fail-safe features significantly improve overall performance.

These and other objects and features of this invention and the manner of attaining them will become apparent, and the invention itself will be best understood, by reference to the following description taken in conjunction with the accompanying illustrative drawings.

BRIEF DESCRIPTION OF THE DRAWINGS

FIG. 9 illustrates schematically interconnections of the diagnostic access panel to the electrical bus.

DESCRIPTION OF THE PREFERRED EMBODIMENTS

Figure 1:
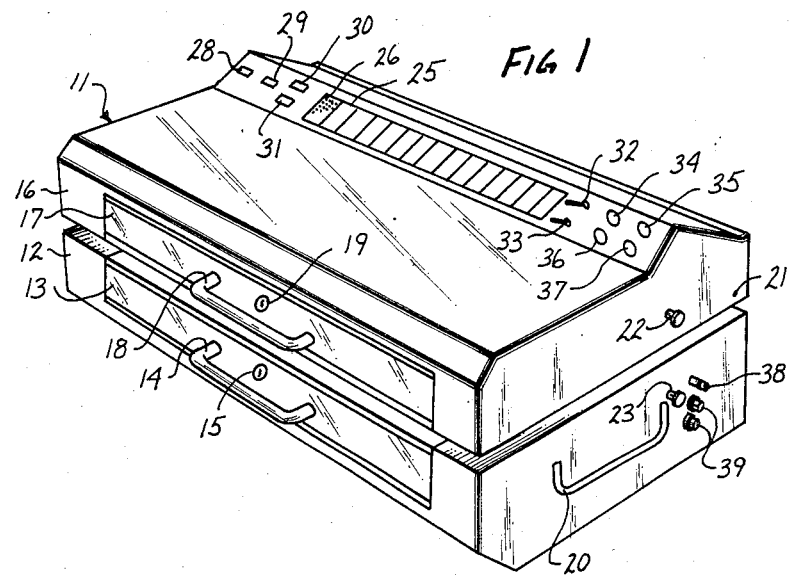
FIG. 1 of the drawings is a perspective view of an apparatus constructed according to the invention.

Referring now to FIG. 1 of the drawings, there is shown a new and improved apparatus 10 constructed according to the invention. It has a size and shape adapted to be placed atop and connected to an existing computerized testing system, such as the testing system sold by the Gen-Rad company of Concord, Mass. under the designation "GENRAD 2272 IN-CIRCUIT TESTER". However, it may take any of various sizes and shapes and otherwise be adapted for use with many existing testing systems within the inventive concepts disclosed.

Generally, the apparatus 10 employs a welded aluminum construction, and it includes a support structure 11 defining a lower platen 12 on which is removably mounted a lower drawer or first test head 13. The test head 13 includes a handle 14 for facilitating manual transportation of the test head 13, and a key-operated lock mechanism 15 for use in inhibiting removal of the test head 13 by unauthorized persons.

The support structure 11 also defines an upper platen 16 in which an upper drawer or second test head 17 is removably mounted. Test head 17 is similar in many respects to test head 13 and it includes a handle 18 and key-operated locking mechanism 19. The test heads 13 and 17 are shaped and dimensioned to mate interchangeably with the platens 12 and 16, and they plug into respective ones of the platens 12 and 16 to adapt the support structure 11 so that it can be used with an existing testing system to test a specified circuit board.

The support structure 11 includes a pair of side handles for use in manually transporting the apparatus 10, only the side handle 20 being visible in FIG. 1. The platens 12 and 16 are pivotally connected with a hinge pin 21, and this enables pivotal movement of the platens 12 and 16 relative to one another from a spaced apart loading position to a more closely spaced apart intermediate position as indicated in phantom lines in FIG. 2 at 16A.

Diagnostic panel 25 is mounted on the support structure in a position conveniently accessible by an operator. It includes an array of electrically conductive contacts 26 that provide operator access to each of the testing system signal lines for diagnostic purposes as will be subsequently discussed.

The apparatus 10 features a complement of operator controls including a start switch 28, a stop switch 29, a pass indicator 30 for us in indicating that the testing of a circuit board has been completed successfully, and a fail indicator 31 for indicating that the test was unsuccessful.

In addition, a pair of latch controls, switches 32 and 33, provide pushbutton control of the pneumatic mechanisms used to draw the test heads 13 and 17 into position on the support structure, as will be subsequently discussed, while indicator 34 indicates engagement of respective ones of a pair of drawbar latches operated by knob 22 on the lefthand side of the support structure 11, and a similar knob on the righthand side of the support structure that is not visible in the drawings.

These knobs are screwed in to engage respective ones of a pair of drawbars that will be subsequently discussed, and they serve as a fail-safe feature that retains the test head 17 in position should there be a loss of pneumatic pressure. When in full engagement with the drawbars, they activate a microswitch that activates the indicator 34. By this means, apparatus 10 is disabled from use until the test heads are properly locked in position, and thus, the circuit board being tested will not be damage by unwanted movement of the test head 17 in the event of a loss in pressure.

Similarly, indicator 35 indicates engagement of respective ones of a second pair of drawbar latches operated by knob 23 on the lefthand side of the support structure 11 and a similar knob on the righthand side of the support structure that is not visible. These knobs are screwed in to engage respective ones of a second pair of drawbars associated with the test head 13, and a microswitch arrangement activates the indicator 35.

Pushbutton 35 is used to activate a pneumatic mechanism that lock the platens in the intermediate position, and pushbutton 36 is used to activate a pneumatic mechanism that draws the platens together from the intermediate position to a position in which probes on the test heads are urged into contact with test points on the circuit board to be tested. Other operator controls and panel configurations can be used, however, within the inventive concepts discussed.

An inlet connector 38 is provide on the lefthand side of the support structure 11 with which to communicate a source of pressurized fluid, air at one hundred psi, for example, that is used to power the pneumatic actuators in the apparatus 10. Controls 39 provide further control of the pressurized fluid according to techniques commonly employed in pneumatic systems.

Figure 2:
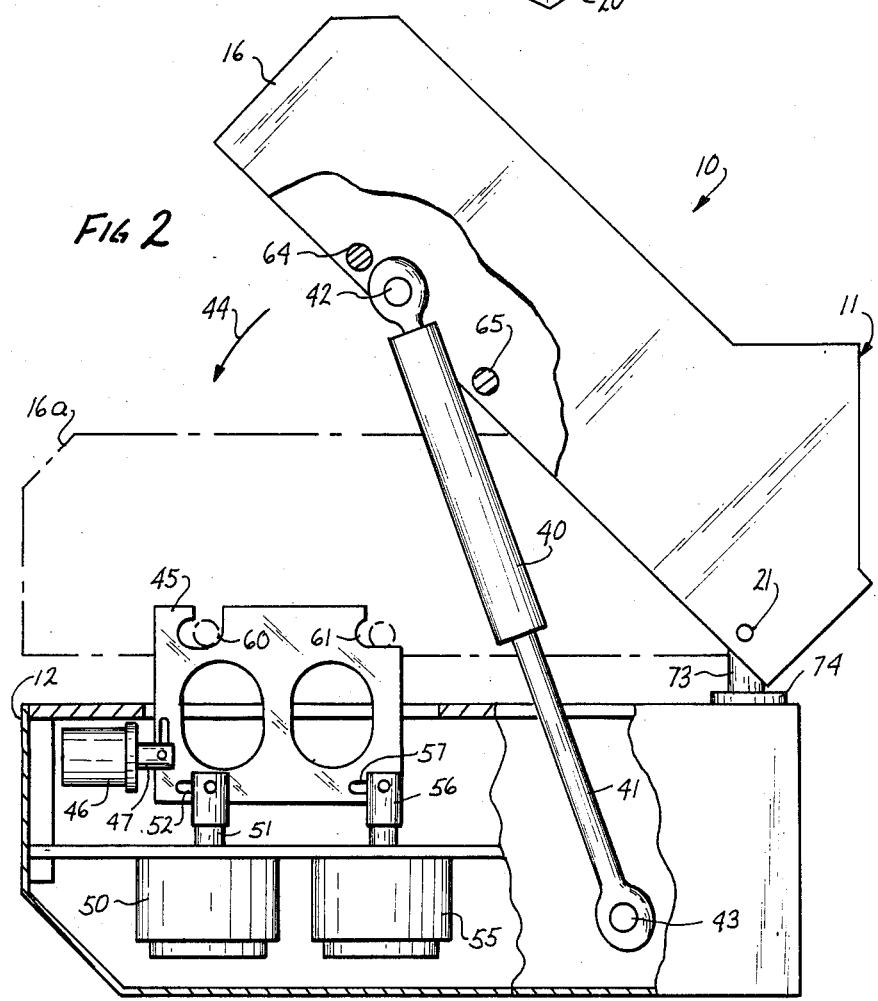
FIG. 2 is a side view of the apparatus with portions broken away to illustrate various pneumatically actuated components and the pivotal action employed in the apparatus.

Considering now FIG. 2, the apparatus 10 is illustrated with the platens 12 and 16 in an open loading position. The platens 12 and 16 are pivoted about pivot pin 21 for this purpose, and this position enables placement of a circuit board to be tested between the test heads 13 and 17 as an initial step in loading the circuit board for testing purposes.

A gas filled damper mechanism of cylinder 40 and piston 41 is connected by pivotal connector 42 to platen 16 and by pivotal connector 43 to platen 12 to dampen movement of platen 16 in the direction of arrow 44. This enables careful movement of the platen 16 to the intermediate position indicated in phantom lines at 16A. A second such damper (not shown) is mounted on the opposite side of the support structure 11 for this purpose. Thus dampened, movement of the platen 16 from the loading position to the intermediate position is restrained to avoid damage to a circuit board in position between the platens.

In the intermediate position, the platens 12 and 16 are in closely confronting relationship, but separated sufficiently so that the circuit board to be tested is not yet fully engaged. Thus, the platens 12 and 16 are closed partially with a clam shell or pivotal action, but then the platen 16 is brought to rest by engagement with locking plate 45 before reaching a fully closed or testing position. The latch bars 60 and 61 abut the locking plate 45 for this purpose, as will be subsequently discussed.

Figure 3:
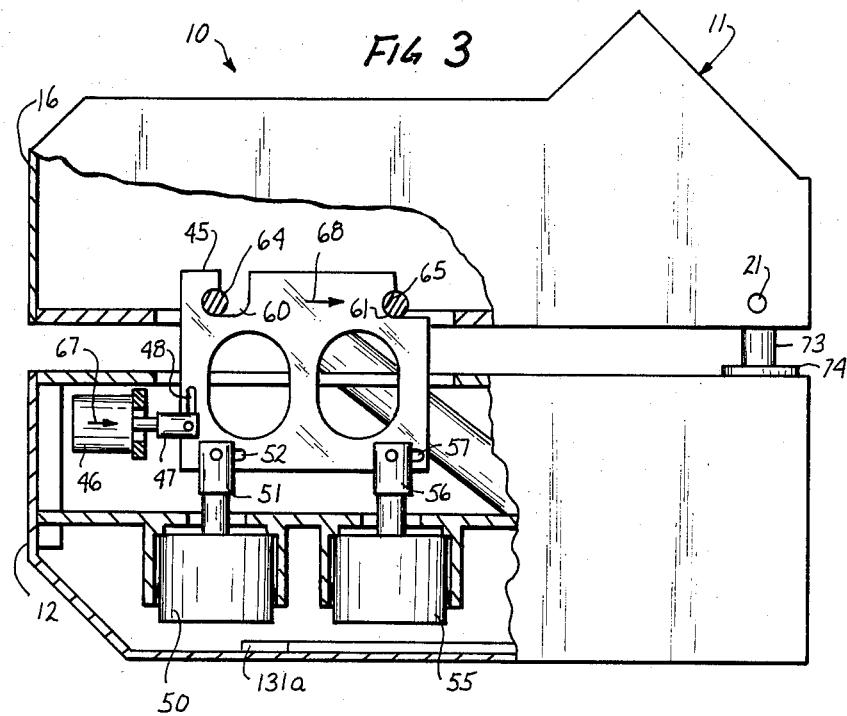
FIG. 3 illustrates the locking action employed in the apparatus.

After the initial pivotal action, the platen 16 is advanced from the intermediate position towards the platen 12 linearly, to maintain precise registration and avoid damage to the circuit board components. This is accomplished with locking plate 45 as illustrated in FIG. 3. A pneumatically driven horizontal drive device or actuator 46 includes a piston 47 that is slideably connected to the locking plate 45 in vertically elongated groove 48 as means for driving the locking plate 45 in a generally horizontal direction, i.e., generally parallel to the confronting faces of the test heads.

Figure 4:
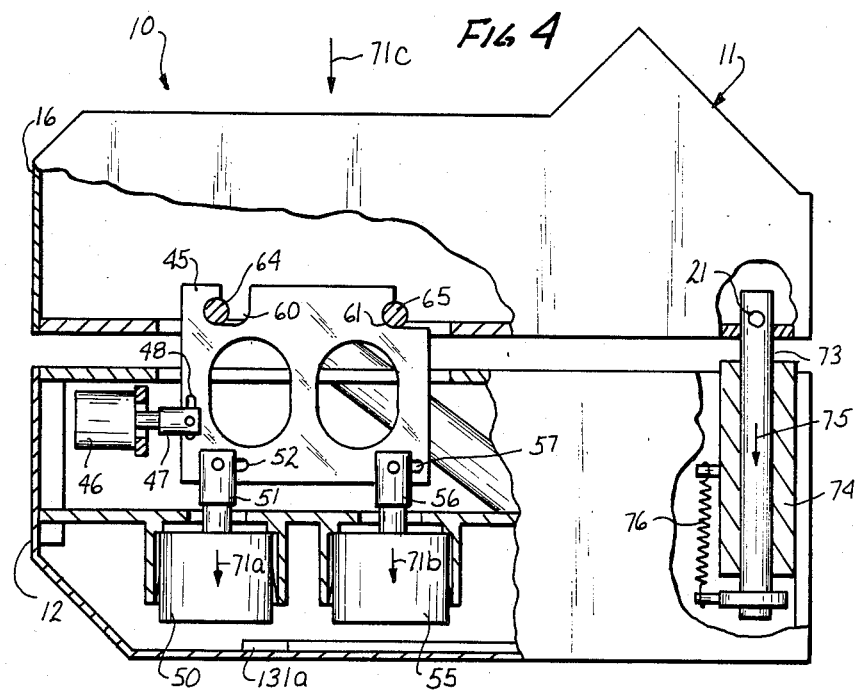
FIG. 4 illustrates the linear compressing action of the apparatus.

Similarly, a first pneumatically driven vertical drive device or actuator 50 includes a piston 51 connected slideably to the locking plate 45 in horizontally elongated groove 42, and this combines with a second pneumatically driven vertical drive device or actuator 55 with a piston 56 connected slideably to the locking plate 45 within horizontally elongated groove 57 to drive the locking plate 45 in a vertical direction (FIG. 4).

Figure 5:
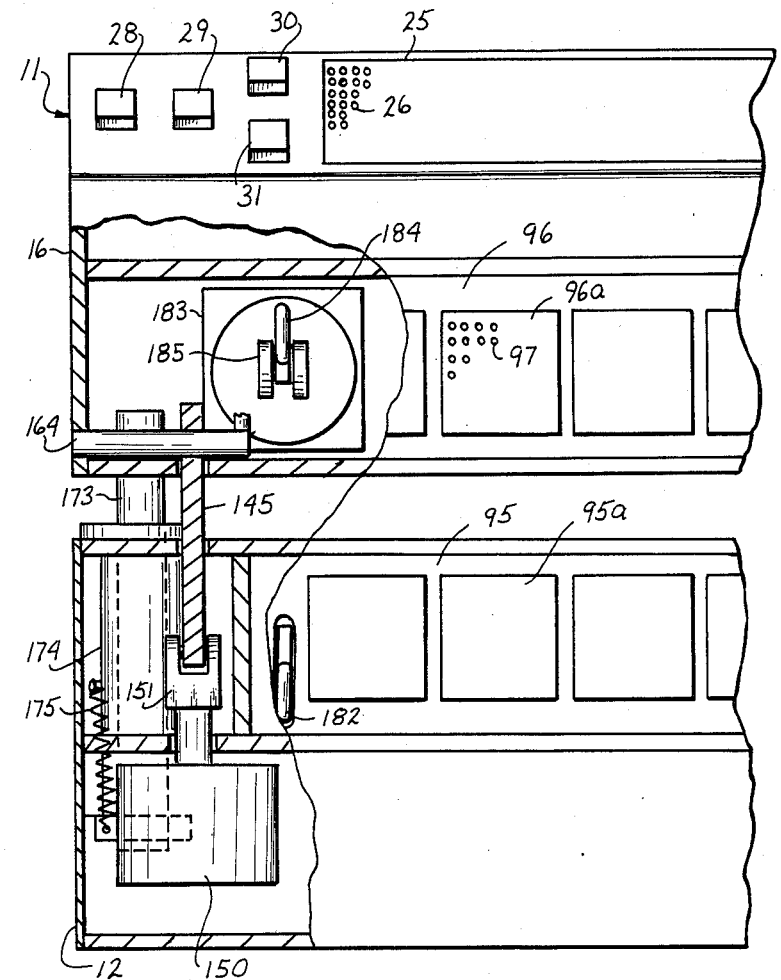
FIG. 5 is a front view of the apparatus with the test heads removed illustrating the test head connector panels and further details of the actuating components.

Counterparts of the locking plate 45 and the actuators 46, 50, and 55 are included on the opposite side of the support structure 11. They employed similar components that function in a like manner, so that they will not be described in detail. Certain ones of the counterparts are illustrated in FIG. 5, where they are designated with reference numerals increased by 100 over those designating similar components on the opposite side of the support structure 11 in FIG. 2. The actuators 46, 50, and 55, as well as the other pneumatic components on the apparatus 10, are commercially available units, accompanied by suitable electrically operated control valves and manifolding according to techniques known in the art.

When the platen 16 is in the loading position, the locking plate is disposed in the position illustrated in FIG. 2, and when the platen 16 is brought to the intermediate position 16A, the latch bars 64 and 65 on platens 16 abut the locking plate 45 within respective ones of right angle grooves 60. This stops the platen 16 from further movement toward platen 12.

Then, by activating the actuator 46 so that the piston 47 moves in the direction of the arrow 67 (FIG. 3) the locking plate 45 is driven in the direction of arrow 68 so that the latch bars 64 and 65 are brought in locking engagement with the locking plate 45 within respective ones of grooves 60 and 61. This retains the platens 12 and 16 in the intermediate position.

After the platens 12 and 16 have been locked in this manner, the actuators 50 and 55 are activated so that the pistons 51 and 56 move in the direction of arrows 71A and 71B (FIG. 4), and this causes the platen 16 to move in the direction of arrow 71C to the testing position, a position in which probes on the test heads (to be subsequently described) are urged into contact with test points on the circuit board.

As the platens are advanced toward one another to the testing position, precision shaft 73 mounted within linear bearing 74 moves in the direction of arrow 75, so that the platen 16 is retained generally parallel to the platen 12 as it moves to the testing position. Spring 76 spring biases the shaft 75 in an upward position so that when the vertical drive devices 50 and 55 are deactivated the platen 16 moves linearly away from the platen 12. Counterparts of these components are mounted on the opposite side of the support structure 11, also. They are generally similar and will not be described in detail.

In addition, a dowel pin 77 on the test head 13 (FIGS. 6, 7, and 9) is received in a mating bushing on the test head 17. The mating bushing on test head is not visible in the drawings, but it is similar to the bushing 78 on test head 13 (FIG. 7). This arrangement provides precise alignment of the test heads as the platens advance to the testing position. Although only one dowel pin is illustrated, this is for illustrative convenience only, and preferably two dowel pins are included on diagonally opposing portions of the test head.

Figure 6:
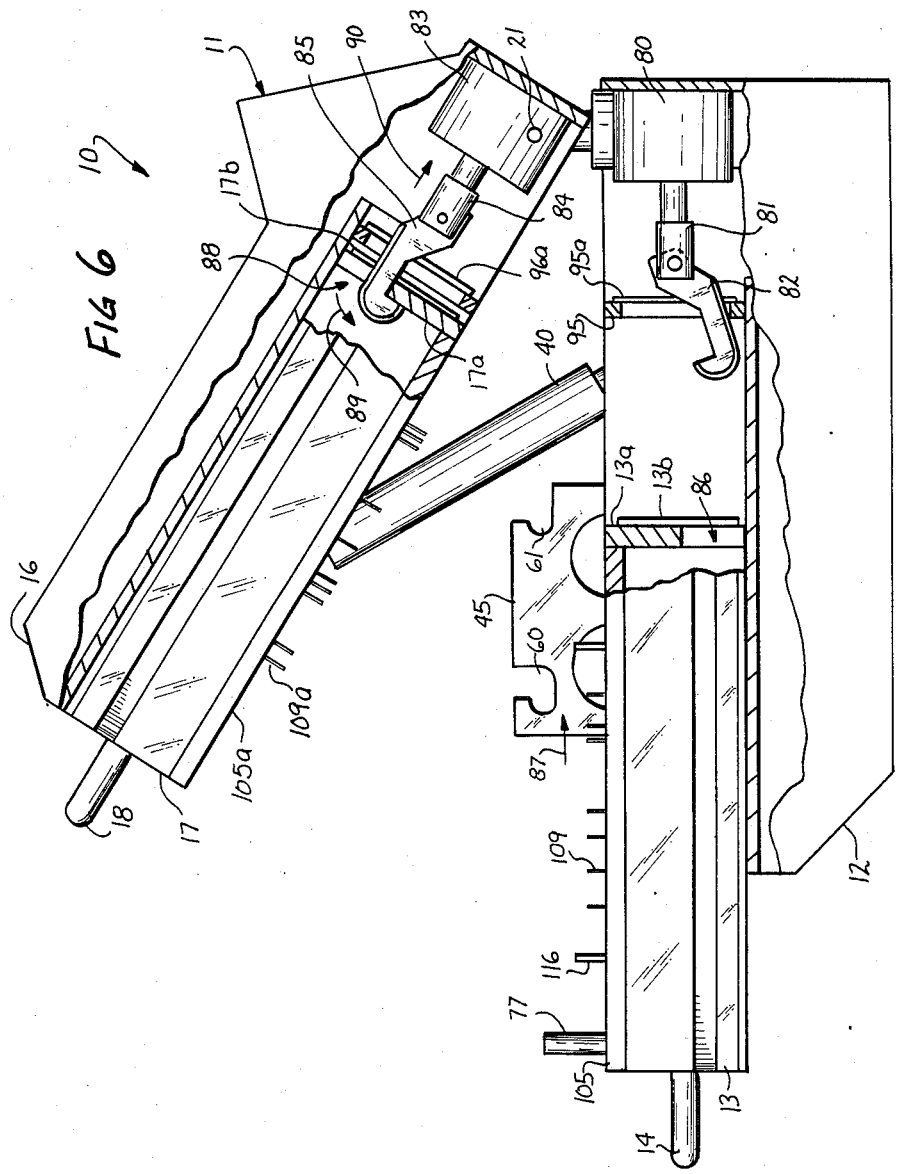
FIG. 6 is a perspective view of one of the test heads with a portion broken away to illustrate the back panel connector arrangement.
Figure 7:
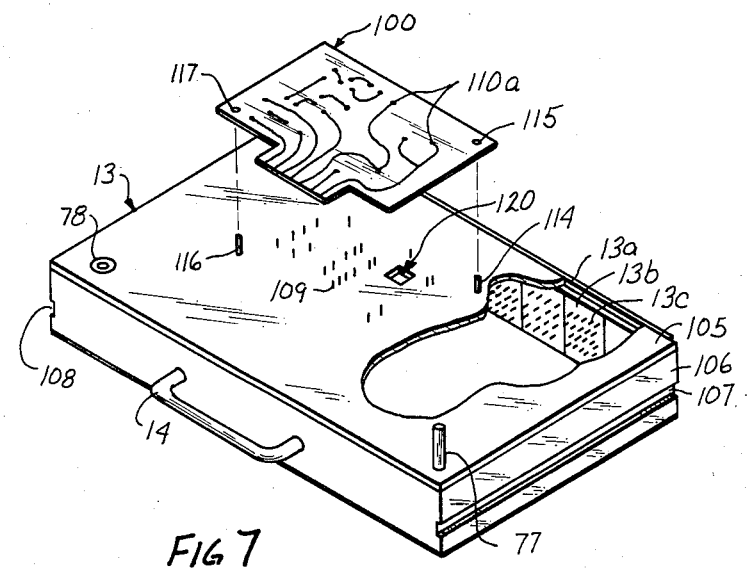
FIG. 7 illustrates the manner in which the test heads are retained in position on the support structure.

Considering now FIGS. 5 and 6, there is shown a pneumatically driven first test head latching mechanism or actuator 80 that serves as means for drawing the first test head 13 into a mounted position on the support structure 11. The actuator 80 includes a piston 81 to which is attached a drawbar or hook member 82. As the test head 13 is manually placed on the support structure 11 and advanced in the direction of arrow 87 toward the actuator 80, the hook member 82 enters the opening 86 in back panel 13A to engage the test head 13.

Test head 17 is illustrated fully mounted in this manner using a pneumatically driven second test head latching mechanism or actuator 83 that includes a piston 84 and drawbar or hook member 85. The hook member 85 extends through opening 88 in back panel 17A. Movement of the hook member 85 in the direction of arrow 89 causes the hook member to engage the back panel 17A. Then the actuator 83 is activated to cause the piston 84 and hook member 85 to move in the direction of arrow 90 and this draws the test head 17 into the fully mounted position on the support structure 11.

Three such actuators are used on each of the platens 12 and 16, and this provides sufficient force to interconnect the test heads 13 and 17 electrically as will be subsequently described. These actuators are also commercially available units, interconnected with suitable electrically operated valves and manifolding according to known techniques.

Further details of the test head 13 are illustrated in FIG. 7 in conjunction with a circuit board 100 which is intended to be tested by using the test head 13. The test head 13 includes an electrically non-conductive plate 105 composed of an antistatic material such as the polyester glass commonly called Poly-10, and it is mounted on a support member 106 that is in the form of a drawer-shaped housing. The housing 106 is a welded aluminum structure provided with grooves 107 and 108 that engage mating runners on the support structure 11 (not shown) to facilitate mounting of the test head 13 on the support structure 11.

A plurality of electrically conductive probes 109 are mounted on the plate 105 in a pattern adapted to mate with a pattern in which a corresponding plurality of test points, such as test points 110, are disposed on circuit board 100. The illustrated points 110 extend fully through the circuit board 100 so that they can be contacted by the probes 109. However, test points that do not extend fully through the circuit board 100, but which lie on the side of the circuit board 100 facing the plate 105, can also be contacted by probes 109. The probes are commercially available spring contact probes, such as those manufactured by A.T.E. Test Labs of Garden Grove, Calif. These typical exhibit about 0.16 inches of travel under about eight ounces of force, and they are available with tips shaped to effectively contact various test points, such as copper pads or component leads.

Figure 8:
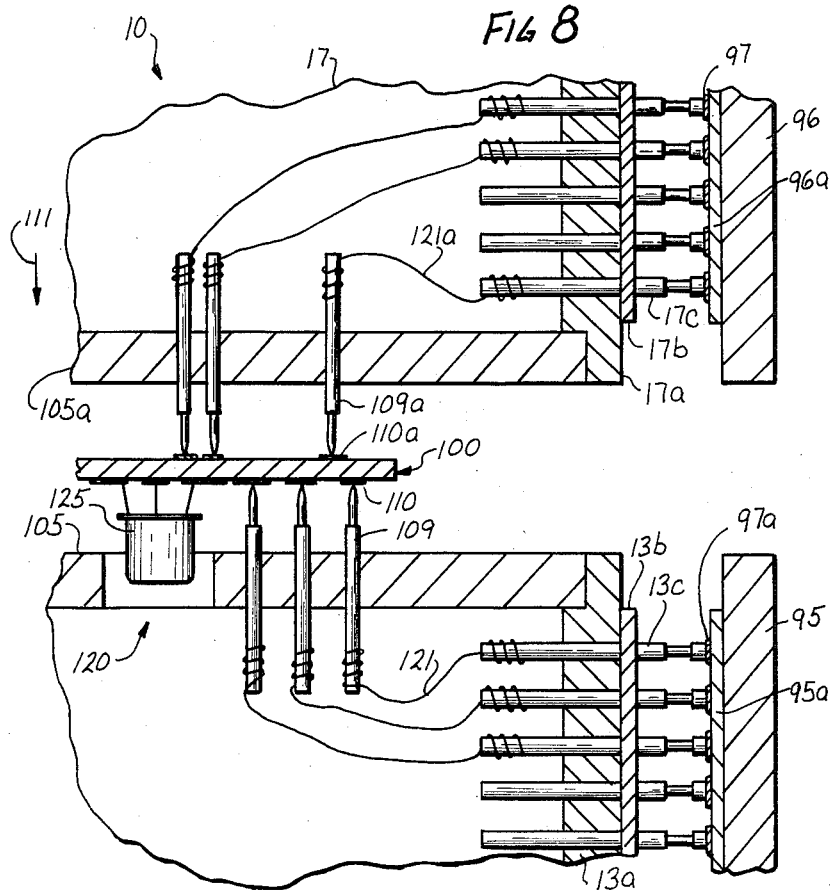
FIG. 8 illustrates details of the electrical connections between the probes on the test head and the test head connector panel on the support structure.

A first guide pin 114 mates with a first guide hole 115 on the circuit 100, and a second guide pin 116 mates with a second guide hole 117 on the circuit board 100 for use in aligning the circuit board 100 with the probes 109. The hole 120 in plate 105 illustrates the manner in which the plate can be configured for use with a circuit board having components that extend beyond the circuit board surface, such as the component 125 in FIG. 8.

In operation, the circuit board 100 is set atop the first test head 13 with the guide pin 114 and 116 within respective ones of guide holes 115 and 117 so that the probes 109 loosely contact the test points 110 on the circuit board. Then, the test head 13 is mounted on the support structure 11 by sliding the support member 106 along runners on the support structure 11 (not shown) that are placed in grooves 107 and 108. Then, the actuator 80 is activated to draw the test head 13 into the fully mounted position and latch it in place.

The test head 17 is generally similar to the test head 13 and will not be described in detail. It may employ a different plate 105A on which is mounted a second plurality of probes 109A in a pattern adapted to mate with the pattern in which a plurality of test points 110A are disposed on a second side of the circuit board 100. The test head 17 is mounted on platen 16 similar to the manner in which test head 13 is mounted on platen 12, so that plates 105 and 105A are facing with circuit board 100 in between.

The test heads 13 and 17 interface the circuit board test points to a plurality of signal lines of a separate testing system (not shown) to be used in testing the circuit board. This is accomplished with a novel combination of interconnections that combine with the diagnostic access panel 25 to provide a superior interfacing apparatus.

The support structure 11 includes a first test head connector panel 95A and second test head connector panel 96A mounted on respective ones of the back panel 95 and the back panel 96 (FIG. 5). These are electrically nonconductive plates composed of an antistatic material, also. Each one of the test head connector panels 95A and 96A includes a plurality of contacts, such as the contacts 97 and 97A on respective ones of the connector panels 96 and 95 in FIG. 8, and these contacts are used to provide connection to the probes 109 and 109A on the test heads 13 and 17.

A second plurality of probes 13C mounted on a second electrically nonconductive plate 13B attached to the back panel 13A of test head 13 is also used for this purpose. Each one of the probes 13C contacts a respective one of the contacts 97A on the test head connector panel 95A when the test head 13 is fully mounted on the support structure 11.

Similarly the test head 17 includes a second plurality of probes 17C mounted on a second plate 17B attached to the back panel 17A, and each one of the second plurality of probes 17C contacts a respective one of the contacts 97A on the first test head connector panel 95A of the support structure 11.

Selected ones of the probes 13C are connected are connected by suitable means such as wire wrapping 121 to a respective one of the probes 109. Similarly, selected ones of probes 17C are connected by suitable means such as wire wrapping 121A to respective ones of probes 109A. Thus, a very convenient and flexible interconnection arrangement is provided between the support structure 11 and the probes 109 and 109A.

An electrical bus or cable 130 (FIG. 9) composed of a plurality of electrically conductive lines (which lines are not individually shown) includes an end 131 connected to the testing system connector panel 131A. Although the connector panel is illustrated on the bottom of the support structure 11, it can be otherwise located, such as at the rear position indicated in phantom lines at 131B. It is located to facilitate connection to the specific testing system employed, and the end 131 interconnects each one of the lines of the cable 130 to a respective one of a plurality of contacts on the testing system connector panel 131A so that the lines can be conveniently and removably connected to respective ones of the signal lines of the testing system to be used.

Although the lines are illustrated for convenience as a unitary cable, each line of the electrical bus preferably consists of a twisted pair of conductors, one of which is at ground potential to provide desired electrical properties for various types of signals.

Branch 132 of the cable 130 interconnects each one of the lines to a respective one of the contacts 97A on the first test head connector panel 95A and branch 13 connects each one of the lines to a respective one of the contacts 97 on second test head connector panel 96A. End 134 of the cable 130 connects each one of the lines to a respective one of a plurality of contacts 26 on diagnostic access panel 25.

Thus, the cable 130 provides a parallel connection of each line to each of the test heads 13 and 17 and to the diagnostic access panel 25, and this enables great flexibility in converting the apparatus of this invention to use in testing a specified circuit board and for enabling an operator to monitor each one of the lines for diagnostic purposes.

According to one aspect of the invention, the diagnostic access panel combines with the support structure, test heads, and electrical bus to provide significantly enhanced functionality. According to another aspect, the double action loading of the platens provides significantly improved alignment of the probes with the circuit board test points, and according to another aspect the test head connector arrangement provides increased convenience and flexibility in converting the apparatus to use with various circuit boards.

Specialized signal access and debug tools are built-in at the diagnostic access panel with consideration of all host machine signal line. As many as two thousand signals are connected in parallel to both test heads, allowing extreme flexibility in accessing circuit board test points.

In addition, pneumatic actuation enables operation with the push of a button and provides interlock for fail-safe operation. The avoidance of a vacuum actuated system eliminates vacuum ports, longer than necessary wire lengths, and moving plates, as well as sealing requirements. Also, the test heads can be easily configured to accommodate large components extending above the circuit board by cutting a hole through the probe plate as a relief.

The pneumatically driven platens can produce more than two thousand pounds of pressure, so that four thousand eight-ounce probes can be used on the test heads. Not only are the test heads low in initial cost, but with minimal expense they are reusable by removing and discarding the probe plate and drilling and rewiring a new probe plate. This aspect enables very low cost experimenting of circuit board accessing requirements without committing costly one-of-a-kind dedicated experimental test heads.

Moreover the elimination of vacuum actuation eliminates static problems associated with the dynamic rush of air across the circuit board under test as air is evacuated from the fixture, and the inherent static problem of various sealing means. A continuous flow of ionized air is provide instead, using a suitable circulation fan and commercially available ionizer bar to thereby bathe the board under test and the associated probe plate with ionized air. In this regard, air can be routed more freely through ports designed into the test heads than with a vacuum actuated system. In addition, the welded aluminum construction further reduces static problems.

Shorter wiring length is required. Easy access increases throughput. Parallel loading reduces abrasive damage to the probes and the circuit board components. Lighter components can be used, and the mechanical locking features isolate the circuit board during tests to reduce the possibility of board damage and operator injury.

Although an exemplary embodiment of the invention has been shown and described, many changes, modifications, and substitutions may be made by one having ordinary skill in the art without necessarily departing from the spirit and scope of this invention.

What is claimed is:

1. An apparatus for interfacing a circuit board to a testing system, comprising:
   a support structure with which to movably support a pair of test heads;
   a pair of first and second test heads mounted in confronting relationship on the support structure, at least the first test head having a plurality of probes with which to contact a corresponding plurality of test points on a circuit board to be tested;
   actuating means for enabling movement of the test heads from a loading position enabling placement of the circuit board between the test heads to a testing position in which each one of the probes is urged into contact with a respective one of the test points;
   electrical bus means, including a plurality of electrically conductive lines, for interfacing a separate testing system to at least the first test head, each of the electrically conductive lines being connected to a respective one of the plurality of probes on the first test head; and
   diagnostic access means for enabling an operator to electrically connect a separate test probe to a selected one of the plurality of probes on the first test head for diagnostic purposes while the first and second test heads are in the testing position;
   said diagnostic access means including a panel of electrically conductive contacts mounted on the support structure;

each of the electrically conductive contacts being electrically connected to a respective one of the plurality of probes on the first test head;

whereby an operator can electrically connect the test probe to a selected one of the probes for diagnostic purposes by contacting an appropriate one of the electrically conductive contacts.

2. An apparatus as recited in claim 1, wherein:
at least the first test head is removably mounted on the support structure to enable the first test head to be changed for purposes of converting the apparatus so that it can be used in testing a different circuit board.

3. An apparatus as recited in claim 1, wherein:
both of the test heads are removably mounted on the support structure.

4. An apparatus as recited in claim 2, further comprising:
first test head connector means for use in removably connecting selected ones of the lines on the electrical bus to the plurality of probes on the first test head when the first test head is mounted on the support structure.

5. An apparatus as recited in claim 4, further comprising:
second test head connector means for use in removably connecting selected ones of the lines on the electrical bus to a second plurality of probes mounted on the second test head to enable simultaneous testing of both sides of a double-sided circuit board.

6. An apparatus as recited in claim 1, wherein the actuating means includes:
means for retaining the test heads in generally parallel relationship as the test heads approach the testing position so that movement of the probes across the test points is limited.

7. An apparatus as recited in claim 1, wherein the actuation means includes:
means for causing the test heads to pivot toward the testing position and then advance linearly to the testing position so that movement of the probes across the test points is limited.

8. An apparatus as recited in claim 1, further comprising:
test head alignment means, including a guide pin on one of the test heads and a portion of the other one of the test heads defining a mating guide hole, for retaining the support members in desired alignment as the support members are moved to the testing position.

9. An apparatus as recited in claim 1, further comprising:
ionizing means, for introducing ionized air adjacent the circuit board to inhibit static damage.

10. An apparatus as recited in claim 1, wherein each of the first and second test heads includes:
a plate on which the plurality of electrically conductive probes are mounted in a pattern adapted to mate with a pattern in which a corresponding plurality of test points are disposed on a circuit board to be tested;
a panel on which a second plurality of electrically conductive probes are mounted in a pattern adapted to mate with a pattern in which a corresponding plurality of contacts are disposed on the support structure, each one of which second plurality of probes is electrically connected to a respective one of the first plurality of probes; and
a support member on which the plate and panel are mounted in generally fixed relationship to one another, which support member is adapted to be mounted on the support structure with each one of the second plurality of probes urged into electrical contact with each one of the plurality of contacts on the support structure, to thereby electrically interconnect the first plurality of probes to the electrical bus means.

11. An apparatus as recited in claim 10, wherein:
the plate is composed of an antistatic material.

12. An apparatus as recited in claim 11, wherein:
the plate is composed of a polyester glass material having antistatic properties.

13. An apparatus as recited in claim 10, wherein:
the support member is in the form of a drawer-shaped structure.

14. An apparatus as recited in claim 10, wherein the support member includes:
a handle to facilitate manual transportation of the support member.

15. An apparatus as recited in claim 10, wherein the plate includes:
registration means for aligning the circuit board to be tested and the plate;
said means including a pin that is dimensioned and arranged to be received in a mating hole on the circuit board.

16. An apparatus as recited in claim 10 further comprising:
alignment means for retaining the first test head in alignment with the second test head;
said means including a dowel pin mounted on the first test head in a position adapted to mate with a bushing mounted on the second test head.

17. An apparatus as recited in claim 1, wherein the support structure includes:
a pair of first and second platens adapted to removably receive and movably support the first and second test heads;
pivotal closure means for enabling pivotal movement of the test heads from a loading position enabling placement of a circuit board to be tested between a pair the test heads to an intermediate in which the test heads are more closely spaced apart; and
linear advance means for enabling advancement of the test heads from the intermediate position to a testing position in which a plurality of probes on the test heads are urged into contact with a corresponding plurality of test points on the circuit board.

18. An apparatus as recited in claim 17, further comprising:
stop means for selectively movement of the platens from beyond the intermediate position toward the testing position.

19. An apparatus as recited in claim 18, further comprising:
locking means for selectively inhibiting movement of the platens from the intermediate position toward the loading position.

20. An apparatus as recited in claim 19, further comprising:
drawdown means for selectively moving the platens from the intermediate position to the testing position against the force of a plurality of spring contact probes.

21. An apparatus as recited in claim 17, further comprising:

at least a first test head positioning means for engaging the first test head and drawing the first test head into a fully mounted position against the force of a plurality of spring contact probes.

22. An apparatus as recited in claim 21, further comprising:

a pneumatically driven test head positioning means; and test head locking means for inhibiting movement of the test heads in the event of a loss in pneumatic pressure;

said means including a manually operated member adapted to engage the pneumatically driven test head position means mechanically.

23. An apparatus as recited in claim 17, further comprising:

damper means for dampening movement of the platens from the loading position to the intermediate position.

24. An apparatus as recited in claim 17, wherein the linear advance means includes:

a precision shaft attached to one of the platens and a mating linear bushing attached to the other one of the platens.

* * * * *

UNITED STATES PATENT AND TRADEMARK OFFICE
CERTIFICATE OF CORRECTION

PATENT NO. : 4,812,754

DATED : March 14, 1989

INVENTOR(S) : Tracy et al

It is certified that error appears in the above-identified patent and that said Letters Patent is hereby corrected as shown below:

Column 5, line 7, change "us" to -- use --.

Column 9, line 34, change "13" to -- 133 --.

Column 12, line 57, after "selectively" insert -- inhibiting --.

Signed and Sealed this

Twenty-second Day of August, 1989

Attest:

DONALD J. QUIGG

Attesting Officer

Commissioner of Patents and Trademarks